(12) United States Patent
Nishiki

(10) Patent No.: US 6,593,161 B2
(45) Date of Patent: Jul. 15, 2003

(54) SYSTEM AND METHOD FOR CLEANING OZONE OXIDATION

(75) Inventor: Hirohiko Nishiki, Tenri (JP)

(73) Assignee: Sharp Laboratories of America, Inc., Camas, WA (US)

( * ) Notice: Subject to any disclaimer, the term of this patent is extended or adjusted under 35 U.S.C. 154(b) by 0 days.

(21) Appl. No.: 10/020,662

(22) Filed: Dec. 12, 2001

(65) Prior Publication Data

US 2003/0109075 A1 Jun. 12, 2003

(51) Int. Cl.[7] ............................................... H01L 21/00
(52) U.S. Cl. ..................... 438/30; 438/906; 438/974
(58) Field of Search ......................... 438/30, 906, 974

(56) References Cited

U.S. PATENT DOCUMENTS

| | | | |
|---|---|---|---|
| 5,082,518 A | 1/1992 | Milinaro | 156/345 |
| 5,445,699 A * | 8/1995 | Kamikawa et al. | |
| 5,464,480 A | 11/1995 | Matthews | 134/1.3 |
| 6,001,539 A * | 12/1999 | Lyu et al. | |
| 6,231,945 B1 * | 5/2001 | Miyamoto et al. | |

OTHER PUBLICATIONS

Article: "A novel resist and post–etch residue removal process using ozonated chemistry", by De Gendt et al., Solid State Technology, Dec. 1998, pp 57–59.

* cited by examiner

Primary Examiner—John F. Niebling
Assistant Examiner—Stanetta Isaac
(74) Attorney, Agent, or Firm—David C. Ripma; Matthew D. Rabdau; Scott C. Krieger

(57) ABSTRACT

A method has been provided for the removal of oxidation from a substrate surface formed as the result of an ozone cleaning process in the fabrication of a liquid crystal display (LCD). A first method uses a dry etchant, such as $CL_2$ gas, to remove the ozone oxidation layer. A second method uses a counter sputtering process to remove the ozone oxidation layer.

26 Claims, 3 Drawing Sheets

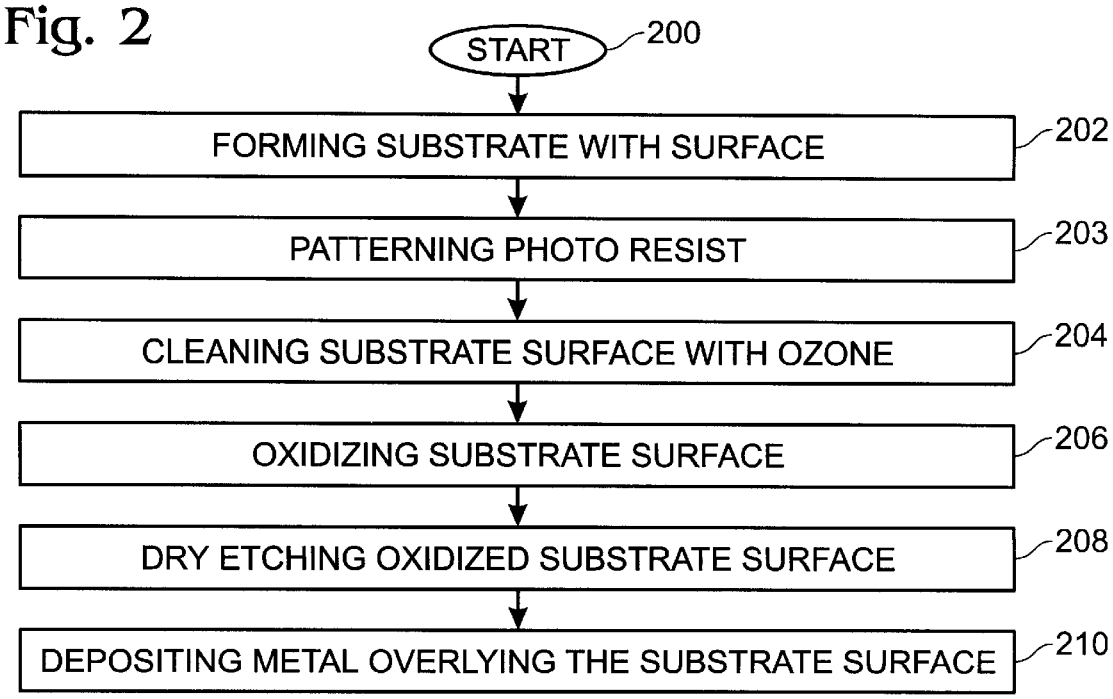
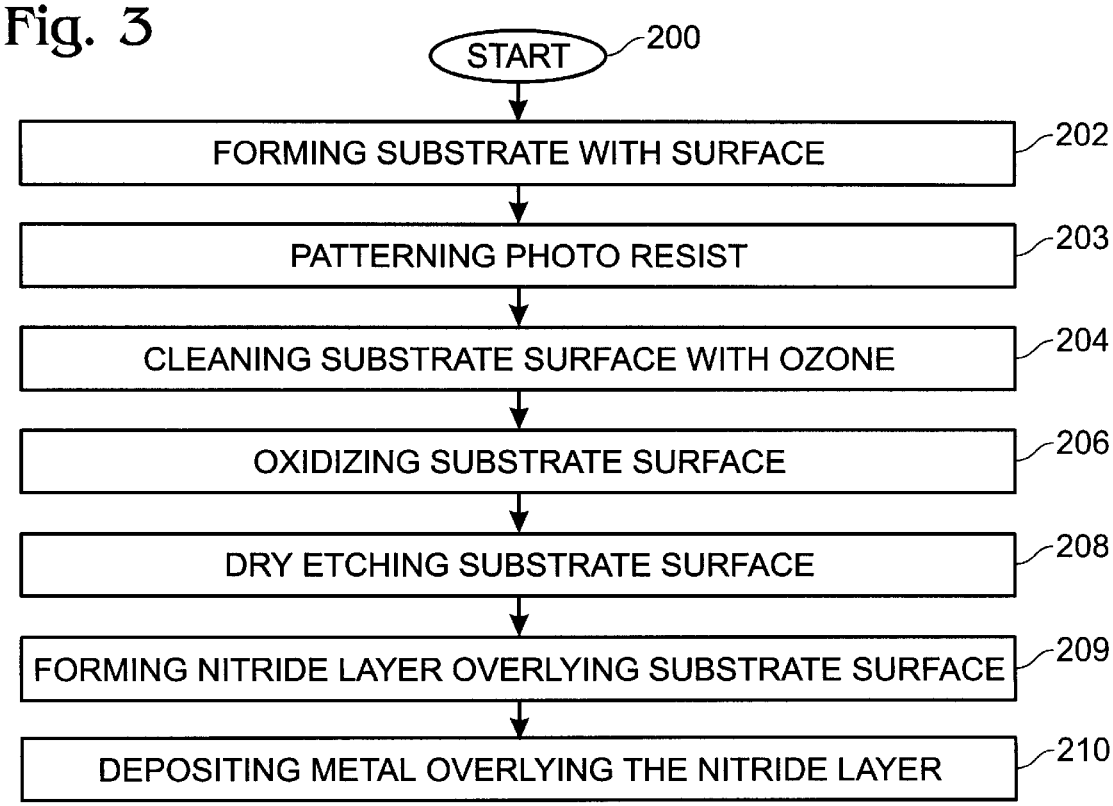

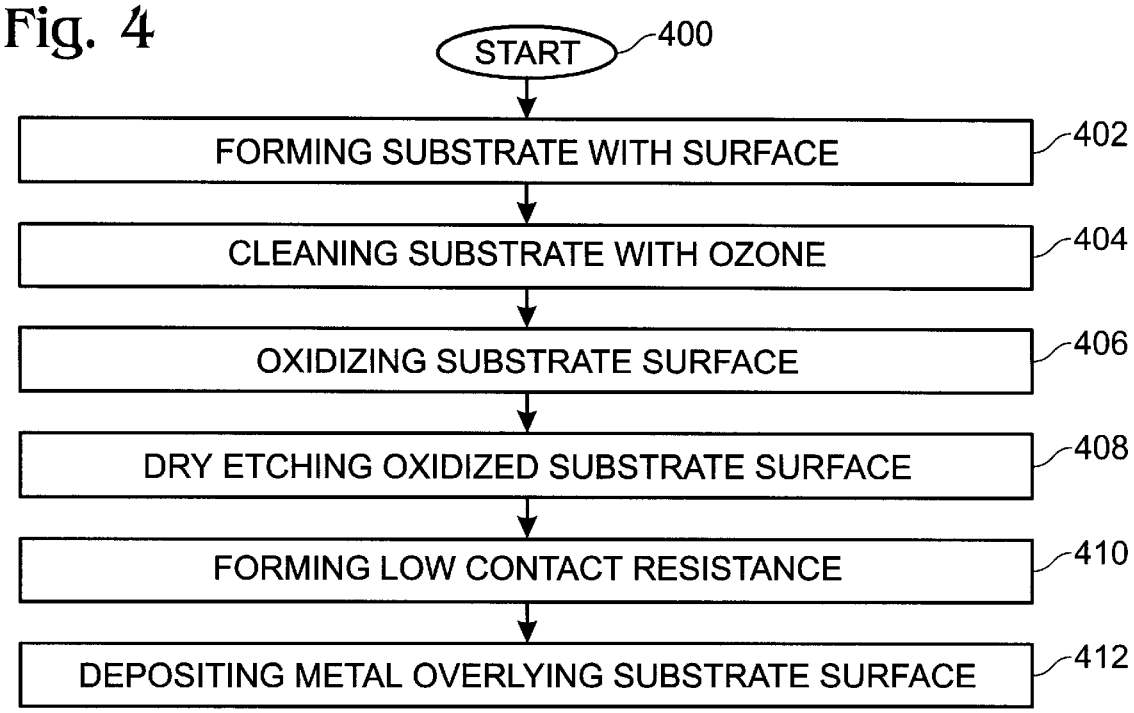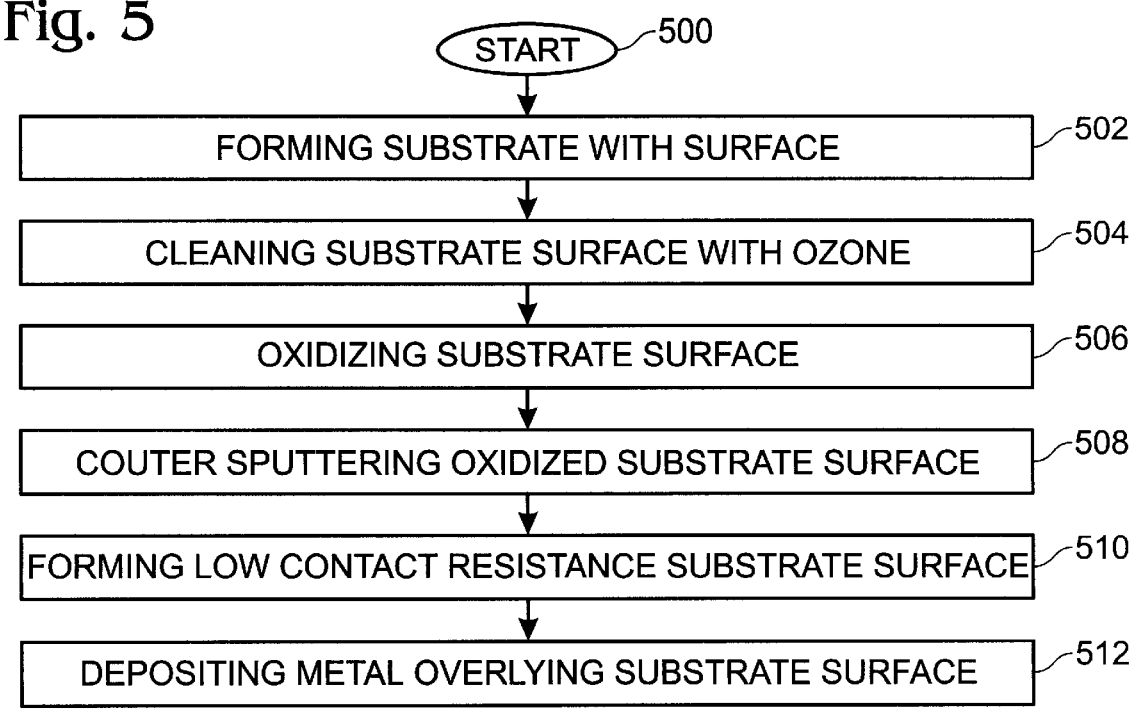

SYSTEM AND METHOD FOR CLEANING OZONE OXIDATION

BACKGROUND OF THE INVENTION

1. Field of the Invention

This invention generally relates to integrated circuit (IC) and liquid crystal display (LCD) fabrication and, more particularly, to a system and method for cleaning IC or LCD substrate surfaces with ozone.

2. Description of the Related Art

An LCD panel is indispensable for notebook type personal computers (PCs) because it is light in weight and thin in profile, as compared to a conventional cathode ray tube (CRT) monitor. The price of LCD monitors continues to decrease, but LCDs continue to be more expensive than CRT monitors. Hence, further reductions in the LCD fabrication process must occur if the LCD is to ever completely replace the CRT. In order to reduce costs in LCD fabrication, new stripping methods using ozone have been developed. In some processes the requirement of an organic strip has been eliminated altogether with the use of ozone strip and clean methods. Organic stripper is expensive and requires special treatment of the surface to be cleaned. Further, organic stripper is toxic and requires expensive waste processes.

As noted in U.S. Pat. No. 5,464,480 (Matthews), in the fabrication of semiconductor wafers, several process steps require contacting the wafers with fluids. Examples of such process steps include etching, photoresist stripping, and prediffusion cleaning. Often the chemicals utilized in these steps are quite hazardous in that they may comprise strong acids, alkalis, or volatile solvents. The equipment conventionally used for contacting semiconductor wafers with process fluid consists of a series of tanks or sinks into which cassette loads of semiconductor wafers are dipped. Such conventional wet processing equipment poses several difficulties.

First, moving the wafers from tank to tank may result in contamination that is extremely detrimental to the microscopic circuits created in the fabrication process. Second, the hazardous chemicals and deionized water which are used have to be regularly replaced with new solutions, usually introduced to the tank by bottle pour, chemical distribution or from building facilities in the case of deionized water. The chemicals generally are manufactured by chemical companies and shipped to the semiconductor manufacturing plant. The chemical purity is thus limited by the quality of the water used by the chemical manufacturers, by the container used for shipping and storing the chemical and by the handling of the chemical.

Moreover, as chemicals age, they can become contaminated with impurities from the air and from the wafers. The treatment of the last batch of wafers prior to fluid rejuvenation may not be as effective as treatment of the first batch of wafers in a new solution. Non-uniform treatment is a major concern in semiconductor manufacturing.

Some of the fluid contact steps of semiconductor manufacture include removal of organic materials and impurities from the wafer surface. For example, in the manufacture of integrated circuits, it is customary to bake a photoresist coating onto a silicon wafer as part of the manufacturing process. This coating of photoresist or organic material must be removed after processing.

Generally, a wet photoresist strip process is performed by a solution of sulfuric acid spiked with an oxidizer of either hydrogen peroxide or ozone. However, there are many disadvantages to using a solution of sulfuric acid and an oxidizer to strip photoresist from wafers during semiconductor manufacture. First, the by-product of the resist strip reaction when hydrogen peroxide is used as the a oxidizer is water, which dilutes the concentration of the bath and thereby reduces its ability to strip photoresist. Second, this process operates at a high temperature, generally between 80 degrees C and 150 degrees C., typically above about 130 degrees C, which mandates the use of special heat resistant materials and components in order to house, circulate and filter the solution, as well as requires extra energy to conduct the cleaning process. Third, the solution is hazardous to handle and dispose of and expensive to manufacture, transport and store.

Moreover, due to the build-up of impurities both dissolved and undissolved in the process bath, the solution must be changed periodically. Typically, the interval for chemical change out is about every eight hours. Because the chemical adversely affects the drain plumbing, the solution must be cooled to less than about 90 degrees C prior to disposal. Thus, use of this photoresist stripping process requires either the use of additional tanks to contain the hot solution or the shut down of the process station during the chemical change period, reducing wafer throughput and increasing cost of ownership.

Finally, after use of a sulfuric acid solution for removal of photoresist, the wafers must be rinsed in hot deionized water since sulfate residues may crystallize on the wafer during processing causing process defects.

Another process often utilized for the removal of organic and metallic surface contaminants is the "RCA clean" process which uses a first solution of ammonium hydroxide, hydrogen peroxide, and water and a second solution of hydrochloric acid, hydrogen peroxide, and water. The RCA cleaning solutions typically are mixed in separate tanks. The wafers are first subjected to cleaning by the ammonium hydroxide solution, then are moved to a rinse tank, then to a tank containing the hydrochloric acid cleaning solution, and then to a final rinse tank. This process, like the sulfuric acid process, has the disadvantage of using strong chemicals. Moreover, the wafers are exposed to air during the transfers from tank to tank, allowing for contamination. Finally, the use of peroxide may cause the wafers to suffer aluminum contamination from the deposition of aluminum in the high pH ammonium hydroxide solution which is not totally removed in the hydrochloric solution.

Various approaches have been taken for improving the processes and equipment used to treat semiconductor wafers with fluid. These attempts to improve on present processes generally involve either a change in equipment or a change in the process chemicals.

U.S. Pat. No. 5,082,518 (Molinaro), describes a different approach to improving the sulfuric acid and oxidizer process of cleaning semiconductor wafers. The system in this patent provides a gas distribution system that includes a sparger plate with diffusion holes for distributing gas throughout the bath in the tank. The Molinaro patent provides an apparatus that distributes ozone directly into the treatment tank containing sulfuric acid. Other approaches use ozone-injected ultrapure water to clean organic impurities from silicon wafers at room temperature. Other methods increase the concentration of ozone in the water to improve the etch rates.

New stripping methods using ozone gas or ozonated water can reduce or eliminate organic stripper, currently used in thin film transistor (TFT) LCD manufacturing. Ozone stripping and cleaning processes are relatively easy to implement and are environmentally friendly. One problem with the use of ozone, however, is in the oxidation of exposed surfaces. Ozone itself is a strong oxidizer, so metal and silicon surfaces that are cleaned with ozone, or even just exposed, are likely to become oxidized. This surface oxidized layer increases the contact resistance between electrodes and buslines, and causes poor LCD panel quality. The critical contact resistance, which causes poor image quality, is strongly dependent on several factors, such as the TFT LCD display size, resolution, and busline materials. Surface oxidized layers need not aggravate image quality in all circumstances. However, the removal of the surface oxidized layer is still important factor in the stabilization of panel quality and the improvement of production yields.

It would be advantageous if the further use of ozone to clean IC and LCD substrate surfaces could be advanced to reduce the use of organic strippers.

It would be advantageous if ozone could be used in cleaning processes where the oxidation of substrate surfaces is an issue.

It would be advantageous if substrate surfaces, oxidized as a result of ozone cleaning, could be easily cleaned of such an oxide.

SUMMARY OF THE INVENTION

The present invention is useful in preventing an electrical connection failure due to substrate surface oxidation, caused by an ozone stripping and cleaning process. The present invention removes the surface oxidized layer before layers are deposited upon the ozone-cleaned surface.

Accordingly, a method is provided for ozone cleaning in the fabrication of LCDs. The method comprises: forming a substrate with a surface material selected from the group including tantalum (Ta), titanium (Ti), tantalum nitride (TaN), and titanium nitride (TiN), aluminum (Al), Al compounds, tungsten (W), chrome (Cr), copper (Cu), silicon (Si), and Si compounds; patterning a layer of photoresist overlying the substrate surface; cleaning the substrate surface with ozone to remove the photoresist; in response to the ozone cleaning, oxidizing the substrate surface; dry etching the oxidized substrate surface; and, depositing a metal such as indium tin oxide (ITO), Ti, Ta, and Al overlying the substrate surface.

Dry etching the oxidized substrate surface includes exposing the oxidized substrate surface to a dry etchant for a period of approximately 30 seconds. Typically, an etching gas such as $Cl_2$, $BCl_3$, $CF_4$, $SF_6$, or $NF_3$ is used to support the etching process. The oxidized substrate surface is dry etched to a depth in the range of 20 Å to 200 Å to remove the oxidized layer.

Additional details of the above-described ozone cleaning process, and an alternate method of removing the ozone-oxidized layer of a substrate surface are presented below.

BRIEF DESCRIPTION OF THE DRAWING

FIG. 2 is a flowchart illustrating a method for ozone cleaning in the fabrication of an LCD.

FIG. 3 is essentially the flowchart of FIG. 2 with additional details.

FIG. 4 is a flowchart illustrating a method for improving contact resistance in the fabrication of LCDs.

FIG. 5 is a flowchart illustrating an alternate method for improving contact resistance in the fabrication of LCDs.

DETAILED DESCRIPTION OF THE PREFERRED EMBODIMENTS

FIGS. 1a through 1d are partial cross-sectional views of an LCD substrate cleaned in accordance with the present invention ozone cleaning process. It should be noted that although the invention is more specifically described in the context of LCD fabrication, the present invention is generally applicable to IC fabrication. As such, LCD fabrication is considered herein to be a particular kind of IC fabrication.

Figure 1A:
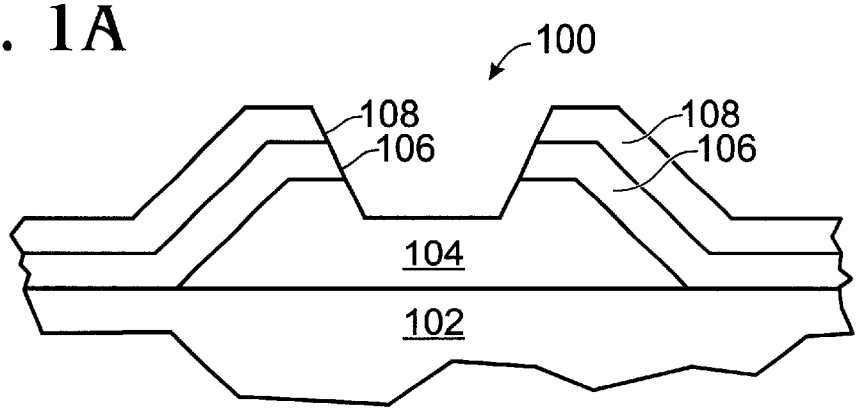
FIGS. 1a through 1d are partial cross-sectional views of an LCD substrate cleaned in accordance with the present invention ozone cleaning process.

FIG. 1a is a view of a bottom gate TFT 100 being fabricated on a glass or plastic substrate 102. Overlying the glass substrate 102 is a patterned gate metal layer 104. Overlying gate metal layer is a gate insulator layer 106. A photoresist pattern 108 is shown overlying the gate insulator layer 106. The gate insulator layer 106 has previously been etched through to the gate metal layer 104 in the area exposed by the photoresist pattern. After this etching step the photoresist pattern is removed.

Figure 1B:
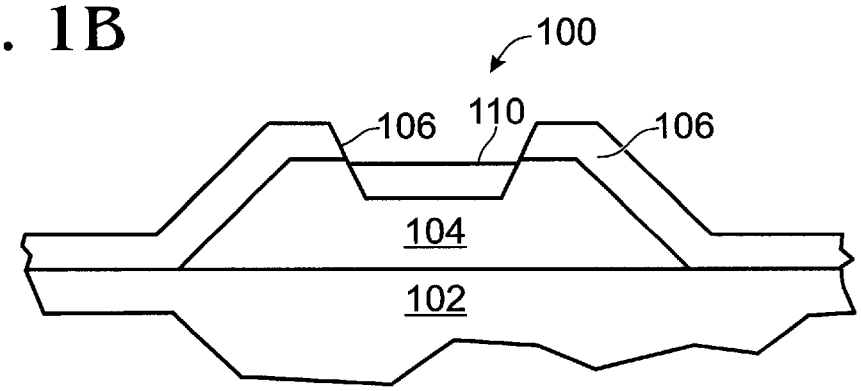

FIG. 1b is the TFT 100 of FIG. 1a following a photoresist strip using ozone. Although the ozone has removed the layer of photoresist (layer 108, see FIG. 1a), the exposure of the gate metal 104 to ozone has resulted in an oxidized gate metal surface 110. If the oxidized surface 110 is not removed, the electrical contact between the gate metal layer 104 and a subsequently deposited conductive material will be degraded. Ta or TaN is easily oxidized by an ozone cleaning process. The contact resistance to a subsequently deposited electrode, when the gate metal layer 104 is made by Ta or TaN, increases with the ozone process time, as the surface oxidation increases with longer process times.

When the gate metal layer 104 is Ta, the contact resistance increases more than three orders of magnitude when an oxide layer is formed having a thickness of 15 millimeters (mm). Too high a contact resistance increases the propagation delay of the electrical signals and causes poor image quality of the LCD panel. Therefore, the contact resistance must be kept low enough.

Figure 1C:
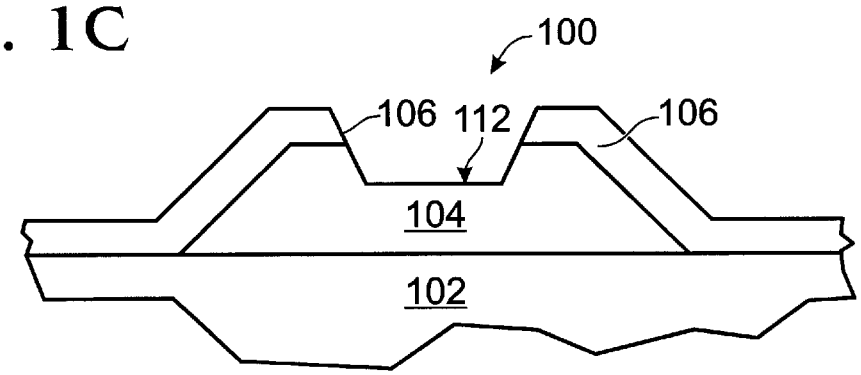

FIG. 1c is a view of the TFT 100 of FIG. 1b following a procedure to remove the oxidized surface 110. The oxide-free surface 112 of the gate metal layer 104 is exposed. One of the ways to remove the oxidized surface 110 is with a dry etching process. A very short dry etching process can typically remove the surface oxidized layer. A dry etching of approximately 30 seconds, depending on factors such as the oxide thickness, the oxide compound, and the etchant, can decrease contact resistance on the surface of the gate metal as much as seven orders of magnitude. A contact resistance in the order of 1000 to 10,000 ohms per square centimeter is typically sufficient for good image quality in a fabricated LCD panel.

Conventional dry etching gases, such as $Cl_2$, can be used for the slight dry etch process mentioned above. Typically, the process gas does not include oxygen or other reactive gases, as these gases may react to form an insulating layer on the gate metal surface 112. However, nitrogenation is sometimes favorable to prevent oxidation from occurring in subsequent processes. The nitrides of some metals sometimes have a low enough resistance to support good image quality, while preventing the oxidation of the gate metal surface 112. Since the dry etching time required to remove a thin oxidized layer is very short, the substrate need not be covered by photoresist to protect other areas of the substrate (not shown) from the etching gases. However, this slight dry etch process can also be used for silicon or other metal areas of the substrate that may have been oxidized by the ozone cleaning, or other fabrication procedures.

Alternately, the surface oxidized layer (layer 110, see FIG. 1b) is removed using a counter sputtering process. As is well known, a conventional sputtering process uses ions to bombard a target for the purpose of depositing target material upon a substrate. Counter sputter, however, uses an ion bombard of the substrate to remove material from the surface of the substrate. In the counter sputtering, ions are accelerated using a high potential DC bias. The high-energy ion bombardment, typically of Ar ions, removes the thin surface oxidized layer. The counter sputtering process can be performed just prior to electrode metal deposition, using convention sputtering equipment and in the same chamber, to minimize the number of process steps. With the counter sputtering, only surface layer is removed, so the remaining areas of the substrate (not shown), need not be protected by photoresist. Again, the counter sputtering process can be used to remove oxide from silicon and metal layers in these remaining areas of the substrate if desired.

Figure 1D:
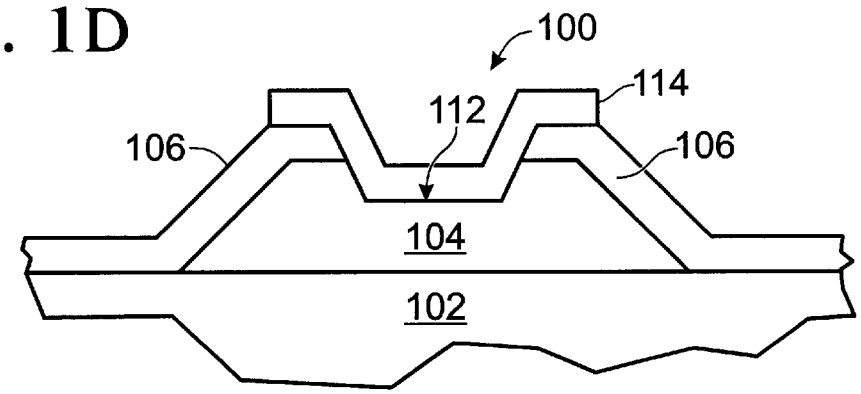

FIG. 1d is a view of the TFT 100 of FIG. 1c following the deposition of an electrically conductive layer 114 over the gate metal surface 112.

FIG. 2 is a flowchart illustrating a method for ozone cleaning in the fabrication of an LCD. Although this method, and the methods describing FIGS. 3 through 5 below, is depicted as a sequence of numbered steps for clarity, no order should be inferred from the numbering unless explicitly stated. It should also be understood that although the process describes the fabrication of an LCD, it has equal applicability to other IC fabrication processes. The method begins at Step 200. Step 202 forms a substrate with a surface material selected from the group including Ta, Ti, TaN, TiN, Al, Al compounds, W, Cr, Cu, silicon, and silicon compounds. Following Step 202, Step 204 cleans the substrate surface with ozone. Step 206, in response to the ozone cleaning, oxidizes the substrate surface. Step 208 dry etches the oxidized substrate surface.

Dry etching the oxidized substrate surface in Step 208 includes exposing the oxidized substrate surface to a dry etchant for a period of approximately 30 seconds. In general, the dry etch is for a relatively slight amount of time. The exact time depends upon factors such as the oxide thickness, oxide compound, the etchant, and the desired contact resistance. The oxidized substrate surface is etched to a depth in the range of 20 Å to 200 Å. The etching depth is related to the etching time, and is closely related to the resultant contact resistance. The etching gas is a conventional etchant such as $Cl_2$, $BCl_3$, $CF_4$, $SF_6$, or $NF_3$.

Some aspects of the invention include a further step. Step 203, following the forming of the substrate surface in Step 202, patterns a layer of photoresist overlying the substrate surface. Then, cleaning the substrate surface with ozone in Step 204 includes cleaning the substrate surface of photoresist.

Other aspects of the invention include a further step. Step 210, following the dry etching in Step 208, deposits a metal or conductant selected from the group including indium tin oxide (ITO), Ti, Ta, and Al overlying the substrate surface.

FIG. 3 is essentially the flowchart of FIG. 2 with additional details. In some aspects of the invention, dry etching the oxidized substrate surface in Step 208 includes adding nitrogen to the etching gas. A further step, Step 209 forms a nitride layer overlying the substrate surface. Then, Step 210 would include depositing the metal overlying the nitride layer.

FIG. 4 is a flowchart illustrating a method for improving contact resistance in the fabrication of LCDs. The method begins at Step 400. Step 402 forms a substrate with a surface material such as Ta, Ti, TaN, TiN, Al, Al compounds, W, Cu, Cr, silicon, and silicon compounds. Step 404 cleans the substrate surface with ozone. Step 406, in response to cleaning with ozone, oxidizes the substrate surface. Step 408 dry etches the oxidized substrate surface. Step 410, in response to the dry etching, forms a low contact resistance substrate surface. Step 412 deposits a metal selected from the group including ITO, Ti, Ta, and Al overlying the low contact resistance substrate surface.

Step 408 includes exposing the oxidized substrate surface to a dry etchant for a period of approximately 30 seconds, using an etching gas such as $Cl_2$, $BCl_3$, $CF_4$, $SF_6$, or $NF_3$. Using this slight dry etch, contact resistances of less than 10,000 ohms per square centimeter can be obtained. Dry etching the oxidized substrate surface in Step 408 includes etching the substrate surface to a depth in the range of 20 to 200 Å.

In some aspects of the invention, dry etching the oxidized substrate surface in Step 408 includes adding nitrogen to the etching gas. Then, a further step, Step 409 (not shown) forms a nitride layer overlying the substrate surface.

In other aspects, a further step, Step 403 (not shown), following the forming of a substrate with a surface in Step 402, patterns a layer of photoresist overlying the substrate surface. Then, cleaning the substrate surface with ozone in Step 404 includes cleaning the substrate surface of photoresist.

FIG. 5 is a flowchart illustrating an alternate method for improving contact resistance in the fabrication of LCDs. The method begins at Step 500. Step 502 forms a substrate with a surface from a material such as Ta, Ti, TaN, TiN, Al, Al compounds, W, Cr, Cu, silicon, or silicon compounds. Step 504 cleans the substrate surface with ozone. Step 506, in response to cleaning the substrate surface with ozone, oxidizes the substrate surface. Step 508 counter sputters the oxidized IC substrate surface in an atmosphere including Ar or He. Step 510, in response to the counter sputtering, forms a low contact resistance substrate surface. Step 512 deposits a metal selected from the group including ITO, Ti, Ta, and Al overlying the low contact resistance substrate surface.

In some aspects of the invention, counter sputtering the oxidized substrate surface in Step 508 includes using a counter sputtering process in situ with the metal deposition process of Step 512.

In other aspects of the invention, a further step, Step 503 (not shown), following the forming of the substrate surface in Step 502, patterns a layer of photoresist overlying the substrate surface. Then, cleaning the substrate surface with ozone in Step 504 includes cleaning the substrate surface of photoresist.

Methods have been provided for cleaning substrate surfaces of oxidation resulting from ozone cleaning processes. Although the processes have been described in the context of LCD fabrication, the same methods are also applicable to more general IC fabrication processes. The methods have also been described using the example of an ozone process to clean photoresist. However, the modification of the above-described method to other processes that generate ozone oxidation would be within the skill of one practiced in the art. As is well known, ozone can be delivered through a variety of mechanisms. Variations and other embodiments of the invention will also occur as a result of specifics in the ozone delivery method.

I claim:

1. In liquid crystal display (LCD) fabrication, a method for ozone cleaning comprising:
    cleaning a substrate surface with ozone;
    in response to the ozone cleaning, oxidizing the substrate surface; and,
    dry etching the oxidized substrate surface.

2. The method of claim 1 wherein dry etching the oxidized substrate surface includes exposing the oxidized substrate surface to a dry etchant for a period of approximately 30 seconds.

3. The method of claim 1 wherein dry etching the oxidized substrate surface includes using an etching gas selected from the group including $Cl_2$, $BCl_3$, $CF_4$, $SF_6$, and $NF_3$.

4. The method of claim 1 further comprising:
    following the dry etching, depositing a metal selected from the group including indium tin oxide (ITO), Ti, Ta, and Al overlying the substrate surface.

5. The method of claim 4 wherein dry etching the oxidized substrate surface includes adding nitrogen to the etching gas; and,
    the method further comprising:
        forming a nitride layer overlying the substrate surface; and,
        wherein depositing a metal selected from the group including ITO, Ti, Ta, and Al overlying the substrate surface includes depositing the metal overlying the nitride layer.

6. The method of claim 1 wherein dry etching the oxidized substrate surface includes etching the substrate surface to a depth in the range of 20 Å to 200 Å.

7. The method of claim 1 further comprising:
    prior to cleaning an IC surface with ozone, forming a substrate with a surface material selected from the group including Ta, Ti, TaN, TaN, Al, Al compounds, W, Cr, Cu, silicon, and silicon compounds.

8. The method of claim 7 further comprising:
    following the forming of the substrate surface, patterning a layer of photoresist overlying the substrate surface; and,
    wherein cleaning the substrate surface with ozone includes cleaning the substrate surface of photoresist.

9. In a liquid crystal display (LCD) fabrication, a method for improving contact resistance, the method comprising:
    forming a substrate with a surface;
    cleaning the substrate surface with ozone;
    in response to cleaning with ozone, oxidizing the substrate surface;
    dry etching the oxidized substrate surface; and,
    in response to the dry etching, forming a low contact resistance substrate surface.

10. The method of claim 9 wherein dry etching the oxidized substrate surface includes exposing the oxidized substrate surface to a dry etchant for a period of approximately 30 seconds.

11. The method of claim 9 wherein dry etching the oxidized substrate surface includes using an etching gas selected from the group including $Cl_2$, $BCl_3$, $CF_4$, $SF_6$, and $NF_3$.

12. The method of claim 9 further comprising:
    depositing a metal selected from the group including indium tin oxide (ITO), Ti, Ta, and Al overlying the low contact resistance substrate surface.

13. The method of claim 12 wherein dry etching the oxidized substrate surface includes adding nitrogen to the etching gas; and,
    the method further comprising:
        forming a nitride layer overlying the substrate surface; and,
        wherein depositing a metal selected from the group including ITO, Ti, Ta, and Al overlying the low contact resistance substrate surface includes depositing the metal overlying the nitride layer.

14. The method of claim 9 wherein dry etching the oxidized substrate surface includes etching the substrate surface to a depth in the range of 20 to 200 Å.

15. The method of claim 9 wherein forming a substrate with a surface includes forming a surface material selected from the group including Ta, Ti, TaN, TiN, Al, Al compounds, W, Cr, Cu, silicon, and silicon compounds.

16. The method of claim 9 further comprising:
    following the forming of a substrate with a surface, patterning a layer of photoresist overlying the substrate surface; and,
    wherein cleaning the substrate surface with ozone includes cleaning the substrate surface of photoresist.

17. The method of claim 9 wherein forming a low contact resistance substrate surface includes forming a substrate surface with a contact resistance of less than 10,000 ohms per square centimeter.

18. In liquid crystal display (LCD) fabrication, a method for improving contact resistance, the method comprising:
    forming a substrate with a surface;
    cleaning the substrate surface with ozone;
    in response to cleaning the substrate surface with ozone, oxidizing the substrate surface; and,
    counter sputtering the oxidized IC substrate surface.

19. The method of claim 18 further comprising:
    in response to the counter sputtering, forming a low contact resistance substrate surface.

20. The method of claim 19 further comprising:
    depositing a metal selected from the group including indium tin oxide (ITO), Ti, Ta, and Al overlying the low contact resistance substrate surface.

21. The method of claim 20 wherein counter sputtering the oxidized substrate surface includes using a counter sputtering process in situ with the metal deposition process.

22. The method of claim 18 wherein counter sputtering the oxidized substrate surface includes counter sputtering in an atmosphere selected from the group including Ar and He.

23. The method of claim 18 wherein forming a substrate with a surface includes forming a gate electrode from a material selected from the group including Ta, Ti, TaN, TiN, Al, Al compounds, W, Cr, Cu, silicon, and silicon compounds.

24. The method of claim 18 further comprising:
    following the forming of the substrate surface, patterning a layer of photoresist overlying the substrate surface; and,
    wherein cleaning the substrate surface with ozone includes cleaning the substrate surface of photoresist.

25. In liquid crystal display (LCD) fabrication, a method for in situ low contact resistance surface preparation comprising:
    forming a gate electrode with a surface;
    cleaning the gate electrode surface with ozone;

in response to cleaning the gate electrode surface with ozone, oxidizing the gate electrode surface;

counter sputtering the oxidized gate electrode surface in an atmosphere selected from the group including He and Ar; and, depositing a metal selected from the group including indium tin oxide (ITO), Ti, Ta, and Al overlying the gate electrode surface.

26. The method of claim 25 further comprising:

following the forming of the gate electrode surface, patterning a layer of photoresist overlying the gate electrode surface; and, wherein cleaning the gate electrode surface with ozone includes cleaning the substrate surface of photoresist.

* * * * *